United States Patent [19]

Watanabe et al.

[11] 4,373,019
[45] Feb. 8, 1983

[54] THICK FILM FINE PATTERN FORMING METHOD

[75] Inventors: Yutaka Watanabe, Machida; Hisayasu Matsuo, Yokohama, both of Japan

[73] Assignee: Fujitsu Limited, Kawasaki, Japan

[21] Appl. No.: 201,023

[22] PCT Filed: Aug. 28, 1979

[86] PCT No.: PCT/JP79/00228
§ 371 Date: Apr. 31, 1980
§ 102(e) Date: Apr. 9, 1980

[87] PCT Pub. No.: WO80/00520
PCT Pub. Date: Mar. 20, 1980

[30] Foreign Application Priority Data

Aug. 31, 1978 [JP]  Japan .............................. 53-106665

[51] Int. Cl.³ .............................................. H05K 3/02
[52] U.S. Cl. ................................... 430/317; 430/313; 430/323; 427/96; 427/259; 427/264; 427/266; 427/269; 427/270; 427/273; 427/376.2; 427/376.3; 427/376.6; 427/419.2; 427/419.5; 427/404; 427/407.1

[58] Field of Search ................ 156/640; 427/96, 259, 427/264, 265, 266, 269, 270, 272, 273, 282, 240, 346, 376.2, 376.3, 376.6, 419.2, 419.5, 404, 407.1; 430/313, 317, 323

[56] References Cited

U.S. PATENT DOCUMENTS

| 3,674,579 | 7/1972 | Clinehems et al. | 156/640 |
| 3,769,111 | 10/1973 | Lagermasini et al. | 156/640 |
| 3,772,104 | 10/1973 | Chandross et al. | 156/640 |
| 4,119,480 | 10/1978 | Nishi et al. | 427/96 |
| 4,230,773 | 10/1980 | Bakos | 427/96 |

OTHER PUBLICATIONS

Larry, Thickfilm Handbook, E. I. Du Pont, Wilmington, DE, pp. 7-2-1 to 7-2-4.

Primary Examiner—Norman Morgenstern
Assistant Examiner—Richard Bueker
Attorney, Agent, or Firm—Staas & Halsey

[57] ABSTRACT

A method of forming a thick film pattern wherein a circuit forming paste (such as conductor paste, resistor paste, etc.), is coated onto an insulated substrate and photo-resist is coated on the surface of the paste film after the paste has been dried. Either the paste or the photo-resist should be oily while the other is aqueous so that the resist and paste may later be selectively dissolved in different liquids. A fine, thick film pattern can then be formed by photo-etching technology.

3 Claims, 10 Drawing Figures

THICK FILM FINE PATTERN FORMING METHOD

BACKGROUND OF THE INVENTION

This invention relates to a method for forming a fine thick film pattern, where the desired circuit pattern is formed by coating a circuit-forming thick film paste on an insulating film substrate, and to a method for economically and easily forming a fine thick film pattern for a very fine circuit, which is particularly effective when used in thick film hybrid ICs and plasma dislay units, etc.

Hybrid ICs are categorized as thick film hybrid ICs or as thin film hybrid ICs in accordance with the film forming method employed.

In the case of a thick film hybrid IC, a circuit film is formed on the substrate using a paste for forming various kinds of circuits. Various kinds of pastes can be obtained in the market, namely, conductor pastes (which can be obtained by mixing a noble metal powder such as Au, Ag, Au-Pt, etc., and glass frit and dispersing this mixture into an organic resin binder solution), resistance pastes (which can be obtained by mixing a high-resistance powder such as Ag-Pd or ruthenium oxide and glass frit and dispersing this mixture into an organic resin binder solution), dielectric pastes (which can be obtained by mixing the powder of a ferrodielectric material such as titanic acid or zircon acid, etc., and glass frit and dispersing this mixture into an organic resin binder solution), or insulating material pastes (which can be obtained by dispersing glass frit into an organic resin binder solution). Currently, mixtures of various kinds of pastes are available from a variety of paste makers. The pastes generally used employ an organic resin binder solution having a certain degree of viscosity. Such binder solutions can be obtained by dissolving an organic resin such as methyl-cellulose, ethyl-cellulose, etc., into an organic solvent having a high boiling point, such as butyl-carbithol or butyl-calbitholacetate, etc.

In the existing thick film pattern forming method, conductor patterns, resistor patterns or capacitor patterns of the desired form are obtained by coating one of the above-mentioned pastes on a ceramic insulated substrate by the screen printing method. Thereafter, wiring conductors, resistors or capacitors are formed on the insulating substrate by baking said circuit pattern.

Thin film hybrid ICs may be formed by using a sputtering system or an evaporation system. A metal such as Au, Al, Ni-Cr, Ta, etc., is evaporated by said system and coated onto the entire surface of an insulated substrate. Thereafter, the unwanted portions of the metallic thin film are eliminated by the photoetching process, and wiring conductors, resistors and capacitors of the desired form can be formed on the insulated substrate by patterning.

The system for forming a paste film on an insulated substrate in the above-mentioned thick film forming method is very economical as compared with the thin film forming method, and requires a relatively short time for film formation with simple controls during formation.

Thus, the conventional thick film method allows low cost circuit substrates to be produced on a mass-production line. But on the other hand, the fine patterns which can be obtained by the thin film forming method cannot be obtained by the conventional thick film forming method.

The existing thick film forming method is limited by the size of the screen mesh, as explained above, because the circuit pattern is formed by screen printing and the pattern width in practice is generally limited at most to 200 $\mu$m, As a result, it is difficult to obtain a pattern having a pattern width of 50 $\mu$m, which can be obtained by the thin film forming method.

For this reason, conventional hybrid ICs having high density electrical circuits are produced by the thin film forming method even if they do not require formation of electrical circuits with high accuracy from the electrical viewpoint. This is very expensive.

In addition, as a special example of the thick film forming method, photo-etching technology can be employed in order to obtain a fine circuit pattern. In this method, a paste containing photo-sensitive material is coated on the insulated substrate and dried. Then, this paste film itself is exposed and developed in order to form the desired circuit pattern. Thereafter, said circuit pattern is baked and a circuit board is thereby obtained.

However, this method is expensive because the paste is obtained by a special production method. Moreover, some film elements cannot be obtained because the commercially available pastes are limited to such types as Au conductive paste or Ag conductive paste, etc. Application of these special pastes complicates handling and also makes it difficult to obtain a homogeneous fine pattern with excellent reproduceability, and examples of practical applications of this thick film method appear to be very rare.

Moreover in plasma displays, which have two sheets of glass substrates respectively providing the X direction electrode pattern and the Y direction electrode pattern and a gap between said glass substrates filled with a rare gas such as neon or helium, etc., the economical self-shift type panel requires a pattern as fine as 60 $\mu$m because said X and Y electrode patterns frequently must be formed in complicated meandering patterns. The pattern formation obtained by the above-mentioned thin film forming method results in relatively high cost.

SUMMARY OF THE INVENTION

It is an object of the present invention to provide, considering the aforementioned background, a method of forming a fine thick film pattern which economically and easily achieves as high a density as the patterns obtained by the thin film forming method.

It is another object of the present invention to provide a method of forming a fine thick film pattern which achieves fine patterns by using ordinary pastes which are marketed for the purpose of forming thick film circuit patterns in place of the above-mentioned specially produced pastes.

It is a further object of the present invention to provide a method of forming a fine thick film pattern which ensures high accuracy and excellent reproduceability.

According to the present invention, these and other objects are achieved by coating a thick film paste onto a substrate and using a photo-resist for patterning the thick film paste. Either the thick film paste or the photo-resist should be oily and include an organic solvent, while the other should be aqueous and should not include an organic solvent. After the thick film paste is coated on the substrate and dried, the photo-resist is coated on the paste film surface. Thereafter, the resist film is exposed and developed to eliminate the exposed regions of the paste film. Finally, the remaining paste film is baked.

According to the present invention, also provided are thick film hybrid ICs produced by the above-mentioned thick film fine pattern forming method.

Accordingly to the present invention, also provided are plasma displays in which discharge electrode pattern groups are produced by the above-mentioned thick film fine pattern forming method.

DESCRIPTION OF THE PREFERRED EMBODIMENTS

Figure 1A:
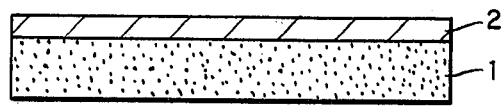
FIGS. 1 (A) to (E) show cross sections illustrating a sequence of different stages in the production of a thick film fine pattern using the method of this invention.
Figure 1B:
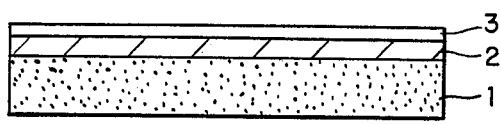
Figure 1C:
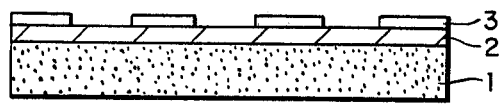
Figure 1D:
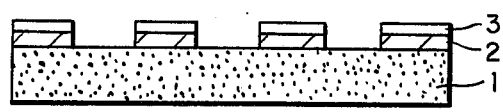
Figure 1E:
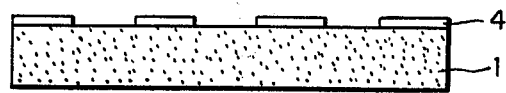

The preferred embodiment of this invention will be explained by referring to the attached drawings.

In the method of the present invention, as shown in FIG. 1 (A), first of all the aforementioned ordinary circuit-forming paste (conductive paste, resistance paste, dielectric paste, insulation paste, etc.) is homogeneously coated to the thickness of 8 to 30 m, by the printing method, on the entire surface of the circuit formation area of the insulated substrate 1. Thus, the paste film 2 can be formed and it is hardened by drying under a temperature of 60° C. to 160° C.

Then, as shown in FIG. 1 (B), a water-soluble photo-resist film 3 which does not include an organic solvent is coated and formed on the entire surface on the paste film 2 of FIG. 1 (A).

Next, in order to eliminate unwanted areas on film 2, the photo-resist film 3 is eliminated as shown in FIG. 1 (C) by exposing the photo-resist film 3 using a mask (not illustrated) and by developing it by dipping it into an aqueous solution.

After development, paste film 2 is selectively removed at the exposed areas by using an organic solvent to dissolve the organic resin binder. Patterns of paste film 2 result, as shown in FIG. 1 (D).

Thereafter, when the paste film 2 of FIG. 1 (D) is baked (for example at 800° to 920° C.), the organic resin binder of said paste film 2 is burned and vaporized as shown in FIG. 1 (E) and the mixed powder in the paste is melted and fixed on the insulated substrate 1. The result is a circuit film 4 having specified electrical characteristics, thereby forming a fine film pattern.

The photo-resist film 3 in FIG. 1 (D) can be baked at the baking temperature and can also be removed in the baking process shown in FIG. 1 (E). Here, a process of previously removing such photo-resist film by dipping into the water before the baking may be added.

Next, a practical manufacturing example of the pattern forming method of this invention will be explained.

First, concerning the drying temperature of circuit formation paste film 2 in FIG. 1 (A), the inventors of this invention conducted experiments for various pastes which are currently used for thick film hybrid ICs and found the adequate drying temperature condition.

This condition is a temperature higher than that where the paste film is not hardened enough to prevent deformation by an external force applied when the photo-resist is coated, but lower than that where the organic binder included in the paste is too hard to be readily removed. More particularly, the drying temperature should lie within the range of 60° C. to 160° C., while the drying period should range from 10 to 60 minutes.

Some of the experimental results of this drying temperature condition are shown in FIG. 2 to FIG. 5. In each figure, the vertical axis represents a drying temperature (°C.), while the horizontal axis represents a drying period (minutes). Portion A represents the over-drying area where the organic binder is hardened and it is difficult to remove the paste film by dissolving it. Portion B represents the under-drying where hardening is insufficient and it is difficult to coat the photo-resist. Portion C represents the adequate drying area where the paste film can be removed easily and the resist film can be coated without deformation.

Figure 2:
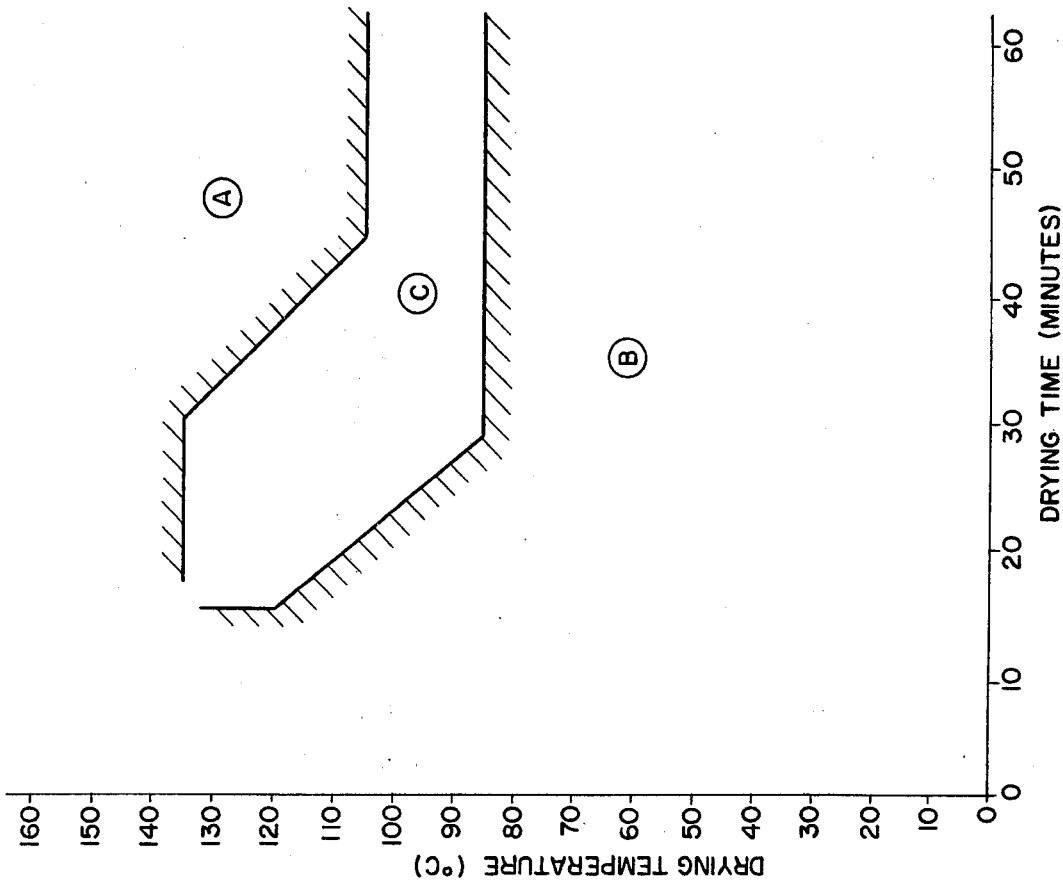
FIG. 2 to FIG. 5 are diagrams indicating the relation between drying temperature and drying time for various kinds of circuit-forming pastes.
Figure 3:
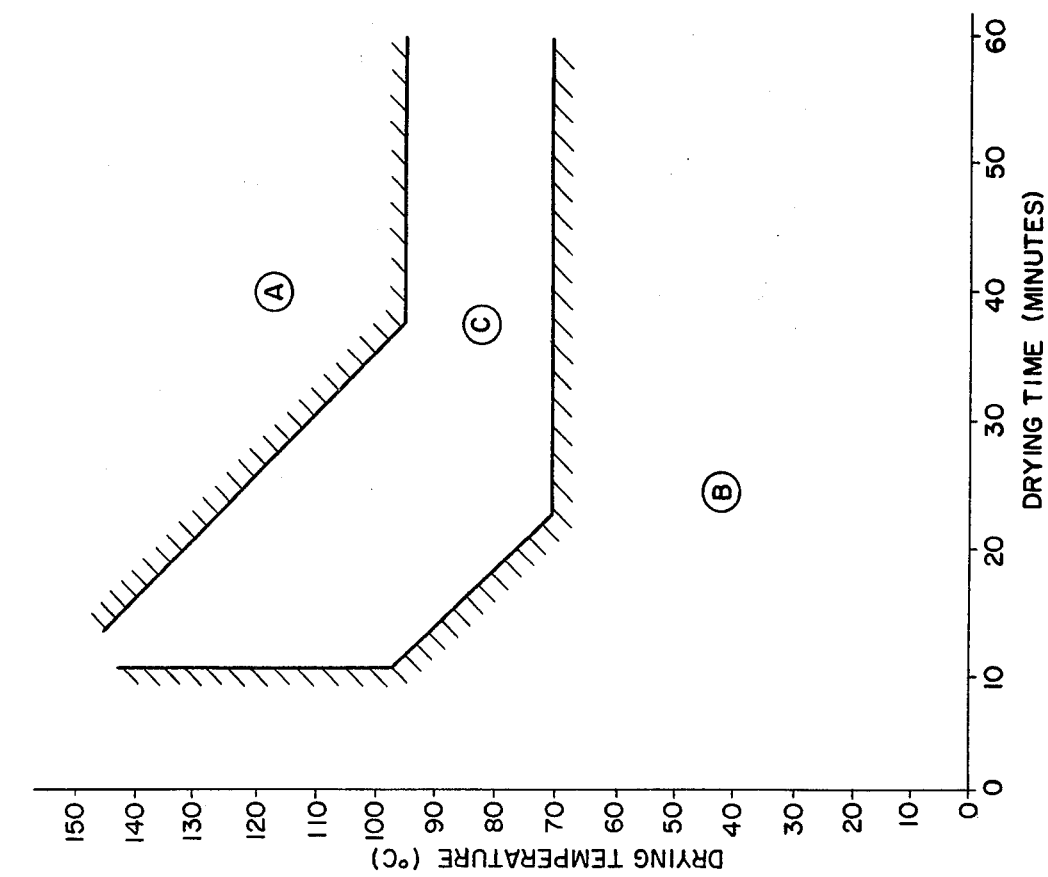
Figure 5:
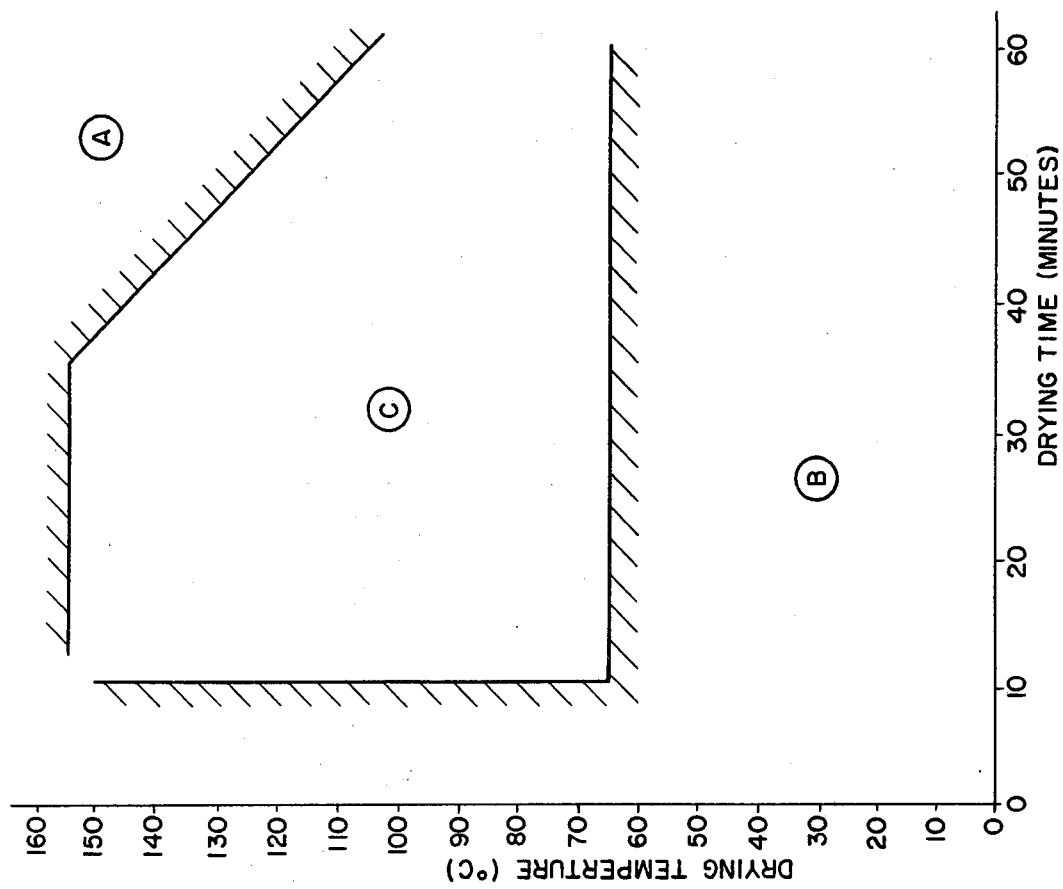
Figure 4:
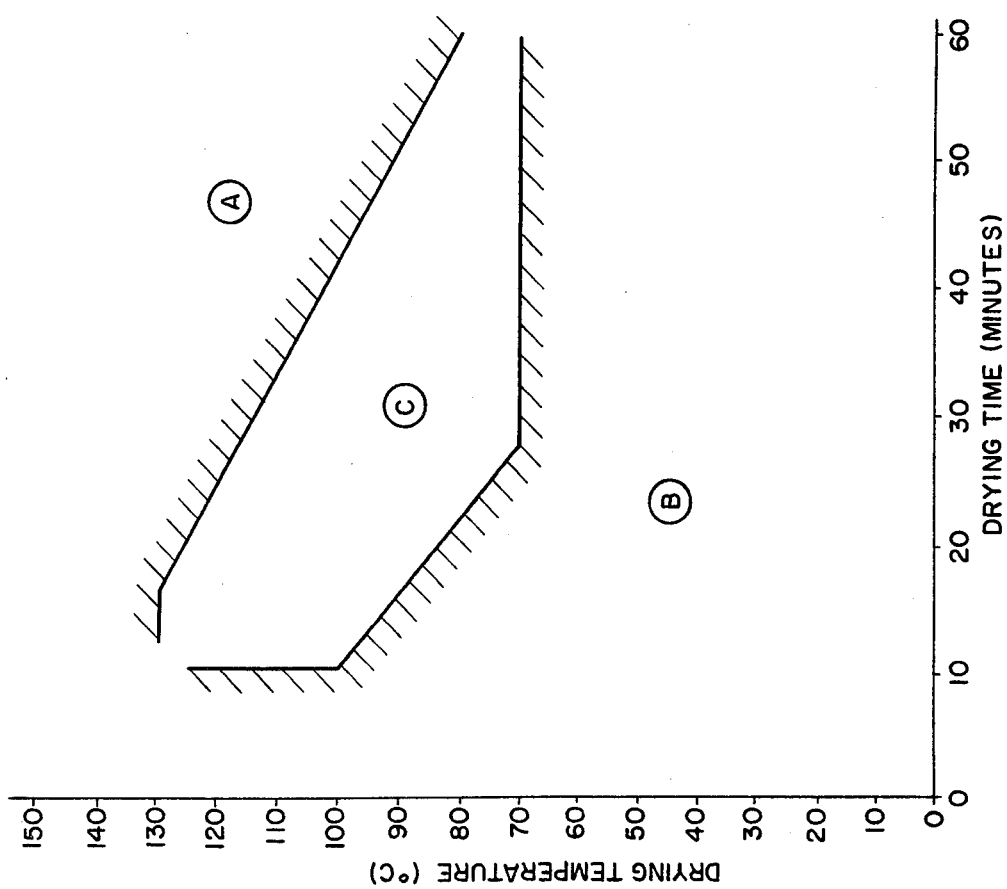

FIG. 2 shows the drying temperature condition of an Au conductor paste available from du Pont and marked "Dp9260". FIG. 3 shows the drying temperature condition of an Au conductor paste available from Shoei Chemical and marked "4405G". FIG. 4 shows the drying temperature condition of a paste availale from du Pont and marked "DP9429", and FIG. 5 shows that of the drying temperature condition of an insulation paste available from Shoei Chemical and marked "51728."

For this experiment, 1,1,1-trichloroethane was used as the organic solvent for removing the paste film, and it was applied by spraying. To form the photo-resist film on the paste film, a water soluble resist liquid (available from Fuji Yakuhin and marked "Fujiron 20") was sprayed while the substrate was rotated at a rate of 500 rpm by a spinner. A resist film formed in this way has a thickness of several $\mu$m (1 to 4 $\mu$m).

As is understood from the results of the experiments discussed above, the drying temperature and time conditions for the paste film are summarized as follows. The adequate drying temperature should be within the range of from 60° C. to 160° C., and the drying time should be 10 minutes or longer, but 60 minutes or less would be desirable from a practical viewpoint.

Such experiments have been conducted for various pastes other than the above-mentioned conductor paste and insulation paste and for resistance paste and dielectric paste, and these also proved that the above drying conditions were adequate.

Further experiments were then performed in order to know what kind of photo-resist is adequate for obtaining fine patterns. The inventors conducted such experiments for various kinds of photo-resists now commercially obtainable and proved that a water soluble resist not having an organic solvent is very effective for forming fine patterns.

Table 1 below shows some of the photo-resists used in this experiment.

TABLE 1

| No. | Photo resist | (identification) | Maker |
|---|---|---|---|
| 1 | AZ-111 | positive type | Shiplay |
| 2 | OMR | negative type | Tokyo Applied Chemical |
| 3 | AZ-1350 | positive type | Shiplay |
| 4 | KPR | negative type | Kodak |
| 5 | OSR | negative type | Tokyo Applied Chemical |
| 6 | Photo ink | negative type | Tokyo Applied Chemical |
| 7 | Fujiron D20 | negative type | Fuji Yakuhin |

When photo-resists No. 1 to No. 6 in the above table were used, formation of a fine pattern was difficult and formation of circuit patterns using the paste film was impossible. But when the photo-resist No. 7 was used, excellent circuit patterns were formed.

The reasons for this will now be developed more concretely. The photo-resists No. 2, No. 4, No. 5 and No. 6 are negative type, and a resist pattern could not be formed because the paste film peeled during development of said photo-resist. On the other hand, when the photo-resists No. 1 and No. 3 were used, the resist pattern could be formed by development, but the circuit patterns could not be formed since they were positive type and a water soluble developer was used.

The reason is that these photo-resists (No. 1 to No. 6) contain an organic solvent such as cellulose acetate, organic amine, xylene, butyl acetate or ketone, and the photo-resist film is formed in such a condition that said organic solvent penetrates into the dried paste film. Moreover, since No. 2, No. 4, No. 5 and No. 6 photo-resists use an organic solvent for which the paste is easily dissolved into the developer, the paste film itself is dissolved into the developer during development. In addition, in the case of the photo-resists No. 1 and 3, since the developer is the water soluble type, the resist penetrated into the paste film where it could not be removed. Simultaneously, since the photo-resist film is soluble in the organic solvent (for example, 1,1,1-trichlorethane, etc.) which is used for removing unwanted paste film, a circuit pattern could not be formed at all.

On the other hand, photo-resist 7 is a water soluble photo-resist which can be obtained by adding a diazo compound to an aqueous solution obtained by heating a mixture of polyvinyl alcohol (PVA) powder and water. The photo-resist thus obtained does not contain any organic solvent and water is used as the developer.

Therefore, when the photo-resist No. 7 is used, the paste film is never influenced by said photo-resist and developer, and it also has a chemically impervious characteristic so that a circuit pattern is formed which has a pattern width almost equal to that of the exposed and developed photo-resist pattern.

Moreover, the paste includes organic solvent and is oily, while the water soluble resist is aqueous, so that they do not mix. Thus, the water soluble resist and developer (water) penetrates only slightly into the paste even if it is in the dried condition. This also seems to be the factor in ensuring the formation of excellent circuit patterns.

The experiments using several other kinds of photo-resists not including an organic solvent (for example, a water soluble resist which includes a substance from the sodium dichromate family) proved that a satisfactory circuit pattern can be formed as in the case of the photo-resist No. 7.

To remove the dried paste film by dissolving it as in FIG. 1 (D), any organic solvent (such as 1,1,1-trichloroethane) which can dissolve a thick film paste can be used, and spraying the organic solvent on the exposed area of the paste film while rotating the substrate was very effective.

Other organic solvents used in the experiments for comparison purpose were acetone, terpineol, isopropyl alcohol, ethyl alcohol, xylene, butyl acetate, cellulose-acetate and trichloroethylene, and all were excellent. From these results, the recommended organic solvents should be nontoxic, inflammable, and easy to handle.

When the substrate was only dipped into the organic solvent, good results were not obtained since a relatively long time was taken for removal of the paste film, and it was difficult to obtain a fine pattern since side etching of the circuit pattern became large. On the other hand, in the above-mentioned organic solvent spraying method, the organic resin in the paste was forcibly removed and the mixed powder was agitated so that the working efficiency was excellent and a fine pattern having sharp edges could be obtained very easily. In addition, when the organic solvent was sprayed on a substrate rotating at a rate of 1000 rpm, the dissolved paste (organic resin, mixed powder) was automatically removed to the outside by the centrifugal force, thus improving results.

The desirable spraying pressure for the organic solvent is 3 kg/cm$^2$ to 20 kg/cm$^2$ when a paste film dried under a temperature 60° C. to 160° C. is removed by means of 1,1,1-trochloroethane, because if the spraying pressure is 2 kg/cm$^2$ or less, a relatively long time is taken for removal, while if it is 21 kg/cm$^2$ or more, there is a danger that the circuit pattern may be deformed or disconnected.

An embodiment of this invention when it is adopted to a product will now be explained hereunder.

Table 2 indicates an embodiment of a hybrid IC. In this table, "I" refers to the formation condition when a straight wiring conductor having a pattern width of 50 μm and a pattern space of 80 μm is formed on an insulated substrate by the forming method of this invention, while "II" refers to the formation condition where a resistance element having a pattern width of 50 μm and pattern length of 80 μm is formed on an insulated substrate by the forming method of this invention.

The conductor and resistance elements thus obtained exhibit electrical characteristics similar to the characteristics of elements having the same pattern width and length obtained by the thin film forming method.

TABLE 2

| | I | II |
|---|---|---|
| Substrate | Aluminum ceramic substrate | Aluminum ceramic substrate |
| Paste | Ruthenium oxide DP1431 | Au-paste DP9260 |
| Paste-thickness | 20 μm | 15 μm |
| Drying condition | 70° C., 15 minutes | 120° C., 15 minutes |
| Photo-resist | Fujiron D20 PVA family | Fujiron D20 PVA family |
| Organic solvent | 1,1,1-trichloroethane | 1,1,1-trichloroethane |
| Spraying pressure | 5 kg/cm$^2$ | 10 kg/cm$^2$ |
| Baking temperature | 870° C., 15 minutes | 850° C., 15 minutes |

Table 3 shows an embodiment of a plasma display. The formation condition was that the discharge electrode pattern having a meandering shape with a pattern width of 60 μm and length of 60 μm was formed on a glass substrate. The plasma display having this electrode pattern exhibits electrical characteristics similar to the characteristics of a plasma display manufactured by the thin film forming method, and the brightness is also excellent for practical use.

TABLE 3

| Substrate | Soda glass substrate |
|---|---|
| Paste | Au paste "#4423" |
| Paste thickness | 10 μm |
| Drying conditions | 110° C., 10 minutes |

TABLE 3-continued

| | |
|---|---|
| Photo-resist | "Fujiron 20" PVA family |
| Organic solvent | 1,1,1-trichloroethane |
| Spraying pressure | 15 kg/cm$^2$ |
| Baking temperature | 580° C., 40 minutes |

Figure 6:
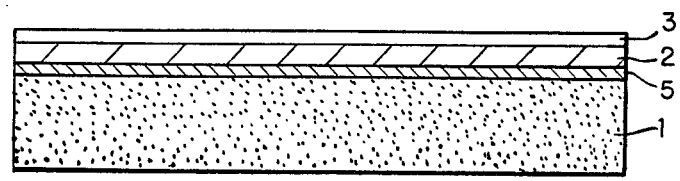
FIG. 6 shows a cross section of another embodiment of this invention.

FIG. 6 shows another embodiment of this invention. In this method, a bonding layer 5 consisting of thermoplastic resin is formed on the substrate 1, the paste film 2 is formed by coating the circuit formation paste on said bonding layer 5, and then a circuit film can be obtained by patterning said paste film 2 with a water soluble photo-resist as explained above.

As the bonding layer 5, a thermoplastic resin having a softening point lower than the drying temperature is used. For example, epoxy resin "Epicoat 1004" and wax, etc. are adequate.

The existence of such a bonding layer reinforces contact between the paste film 2 and substrate 1 and thereby retards deviation of the pattern when the organic solvent is sprayed. Thus, fine patterns (40 μm or less) can be formed.

In addition, the surface of the dry paste film 2 is considerably uneven and therefore the surface of the water soluble resist formed on said paste film also becomes uneven, thus making the contact between the mask and paste film 2 non-uniform during exposure. For this reason, circuit patterns having sharp edges cannot be obtained easily.

However, the surface of paste film 2 may be smoothed by brushing with a glass fiber brush, etc., and thereafter the water soluble resist film is formed on said paste film surface. This method is very effective for obtaining fine circuit patterns.

According to this invention, as explained above, a fine pattern as accurate as the circuit pattern obtained by the thin film forming method can be obtained by the thick film forming method, and moreover this method is economical and simple as compared with the thin film forming method.

Additionally, circuit patterns obtained by this invention exhibit electrical characteristics similar to those of elements produced by the existing thin film forming method, thereby encouraging practical application.

With the above-mentioned embodiments, the following modifications are all covered by the present invention.

First, a liquid resist is used as the water soluble resist in the above embodiment, but it is also possible to use a water soluble resist film formed on the paste film by the thermal bonding method.

In above embodiment an oily circuit formation paste is used, and it may also be possible in the future to use an aqueous paste not including organic solvent.

Therefore, this invention also includes the use of an aqueous paste sprayed by an aqueous solution, with an oily photo-resist being applied if an aqueous paste is used.

We claim:

1. A method of forming a thick film fine pattern on a substrate, comprising the steps of:
    coating the surface of the substrate with a thermoplastic resin bonding layer;
    coating said bonding layer with a thick film circuit forming paste including an organic solvent;
    drying the paste;
    coating the dried paste with water soluble photoresist;
    exposing a pattern onto the photo-resist;
    developing the photo-resist to expose portions of the paste;
    eliminating the exposed paste; and
    baking the substrate.

2. A method of forming a thick film fine pattern as claimed in the claim 1, wherein the step of coating the surface of the substrate with a thermoplastic resin bonding layer is conducted by coating the surface of the substrate with a thermoplastic resin having a softening point below the drying temperature of the thick film paste.

3. A method of forming a thick film fine pattern as claimed in the claim 1 or 2, further comprising the step of smoothing the surface of the thick film paste before coating the paste with photo-resist.

* * * * *

UNITED STATES PATENT AND TRADEMARK OFFICE
CERTIFICATE OF CORRECTION

PATENT NO. : 4,373,019

DATED : February 8, 1983

INVENTOR(S) : Watanabe et al.

It is certified that error appears in the above-identified patent and that said Letters Patent is hereby corrected as shown below:

Front page, [57] ABSTRACT, line 3, delete "," (second occurrence).

Col. 1, line 10, after "and" insert --in more detail--;
line 13, "dislay" should be --display--;
line 42, "bitholacetate" should be --bithol-acetate--.

Col. 3, line 30, "m" should be -- µm--.

Col. 4, line 15, after "drying" insert --area--;
line 25, "availale" should be --available--;
line 26, delete "that of".

Col. 5, line 29, "chlorethane" should be --chloroethane--.

Signed and Sealed this

Third Day of January 1984

[SEAL]

Attest:

GERALD J. MOSSINGHOFF

Attesting Officer

Commissioner of Patents and Trademarks